United States Patent
Li

(10) Patent No.: US 10,392,297 B2
(45) Date of Patent: Aug. 27, 2019

(54) METHOD FOR MANUFACTURING SUBSTRATE

(71) Applicants: Shenzhen China Star Optoelectronics Technology Co., Ltd., Shenzhen (CN); Wuhan China Star Optoelectronics Technology Co., Ltd., Wuhan (CN)

(72) Inventor: Zijian Li, Shenzhen (CN)

(73) Assignees: SHENZHEN CHINA STAR OPTOELECTRONICS TECHNOLOGY CO. LTD., Shenzhen (CN); WUHAN CHINA STAR OPTOELECTRONICS TECHNOLOGY CO. LTD., Wuhan (CN)

( * ) Notice: Subject to any disclaimer, the term of this patent is extended or adjusted under 35 U.S.C. 154(b) by 0 days.

(21) Appl. No.: 14/897,858

(22) PCT Filed: Oct. 8, 2015

(86) PCT No.: PCT/CN2015/091471
§ 371 (c)(1),
(2) Date: Feb. 13, 2018

(87) PCT Pub. No.: WO2017/041339
PCT Pub. Date: Mar. 16, 2017

(65) Prior Publication Data
US 2018/0155237 A1    Jun. 7, 2018

(30) Foreign Application Priority Data
Sep. 10, 2015    (CN) .......................... 2015 1 0573490

(51) Int. Cl.
*C03C 17/22* (2006.01)
*H01L 27/12* (2006.01)
(Continued)

(52) U.S. Cl.
CPC ............ *C03C 17/225* (2013.01); *C03C 15/00* (2013.01); *C03C 17/23* (2013.01); *C03C 17/30* (2013.01);
(Continued)

(58) Field of Classification Search
None
See application file for complete search history.

(56) References Cited

U.S. PATENT DOCUMENTS 6,391,747 B1 * 5/2002 Okumura ............ H01L 21/2026
438/478
2003/0012925 A1 * 1/2003 Gorrell ............ H01L 21/30608
428/137
(Continued)

FOREIGN PATENT DOCUMENTS

CN    100485889 C    5/2009
CN    101561598 A    10/2009
(Continued)

OTHER PUBLICATIONS

Notification of Transmittal of the International Search Report and the Written Opinion of the International Searching Authority (Forms PCT/ISA/210, PCT/ISA/220, and PCT/ISA/237) dated Jun. 6, 2016, by the State Intellectual Property Office of People's Republic of China in corresponding International Application No. PCT/CN2015/091471. (11 pages).
(Continued)

*Primary Examiner* — Stephanie P Duclair

(57) ABSTRACT

A method for manufacturing a substrate is disclosed. The method comprises the following steps: step one, depositing an amorphous silicon layer on a base material; step two, depositing a silicon dioxide layer with a first thickness on the amorphous silicon layer; and step three, etching the silicon dioxide layer until a thickness thereof is reduced to a second thickness. According to the method of the present disclosure,
(Continued)

the silicon dioxide layer with a needed thickness can be manufactured on the amorphous silicon layer. When the ELA procedure is performed, the silicon dioxide layer has an enough thickness to prevent the formation of protrusions at grain boundary of polysilicon, so that the semi-conductive layer manufactured therein can have a relatively low roughness.

9 Claims, 2 Drawing Sheets

(51) Int. Cl.
  *H01L 31/18* (2006.01)
  *H01L 21/324* (2006.01)
  *H01L 21/02* (2006.01)
  *H01L 29/786* (2006.01)
  *C03C 17/34* (2006.01)
  *C03C 17/23* (2006.01)
  *C03C 15/00* (2006.01)
  *C03C 17/30* (2006.01)
(52) U.S. Cl.
  CPC ...... *C03C 17/3435* (2013.01); *C03C 17/3482* (2013.01); *H01L 21/02296* (2013.01); *H01L 21/02675* (2013.01); *H01L 21/324* (2013.01); *H01L 27/1285* (2013.01); *H01L 29/786* (2013.01); *H01L 31/1864* (2013.01); *C03C 2217/213* (2013.01); *C03C 2217/281* (2013.01); *C03C 2218/33* (2013.01); *C03C 2218/345* (2013.01)

(56) References Cited

U.S. PATENT DOCUMENTS

| | | |
|---|---|---|
| 2005/0272184 A1* | 12/2005 | Hiramatsu .......... H01L 21/2026 438/149 |
| 2007/0207487 A1 | 9/2007 | Emig et al. |
| 2009/0033362 A1 | 2/2009 | Manger et al. |
| 2014/0057419 A1* | 2/2014 | Tian .................. H01L 21/02436 438/487 |
| 2014/0342101 A1 | 11/2014 | Peng et al. |
| 2017/0004970 A1 | 1/2017 | Niu et al. |

FOREIGN PATENT DOCUMENTS

| | | |
|---|---|---|
| CN | 102655089 A | 9/2012 |
| CN | 203690350 U | 7/2014 |
| CN | 104167349 A | 11/2014 |
| CN | 104658891 A | 5/2015 |

OTHER PUBLICATIONS

Office Action dated Jun. 20, 2017, by the State Intellectual Property Office of People's Republic of China in corresponding Chinese Patent Application No. 201510573490.9. (6 pages).

* cited by examiner

METHOD FOR MANUFACTURING SUBSTRATE

CROSS REFERENCE TO RELATED APPLICATION

The present application claims priority of Chinese patent application CN201510573490.9, entitled "Method for Manufacturing Substrate" and filed on Sep. 10, 2015, the entirety of which is incorporated herein by reference.

FIELD OF THE INVENTION

The present disclosure relates to display technology, and particularly to a method for manufacturing a substrate.

BACKGROUND OF THE INVENTION

In a flat display device, amorphous silicon is generally used to serve as a semi-conductive layer. However, with the development of flat display device towards high resolution, high integration, and low power consumption, these properties can hardly be realized by amorphous silicon. Therefore, polysilicon is used to meet the development requirement of flat display device, and thus Low Temperature Poly-Silicon (LTPS) has been widely used.

In LTPS technology, amorphous silicon is melted through Excimer Laser Annealing (ELA) method, and polysilicon can be formed after crystallization. According to the traditional technology, before ELA is performed, the original silicon dioxide layer on a surface of silicon semi-conductive layer is etched by hydrofluoric acid. Then, the silicon is oxidized by ozone ($O_3$), so that a silicon dioxide layer with a needed feature can be formed on the surface of the silicon semi-conductive layer. During ELA procedure, the silicon dioxide layer generated therein can play a role of heat preservation. However, since the oxidation capacity of ozone is limited, a thickness of the silicon dioxide layer generated therein is only about 3 nm in general. Since the thickness of the silicon dioxide layer is too small, the formation of protrusions by melted amorphous silicon at grain boundary during crystallization procedure cannot be prevented. As a result, the semi-conductive layer manufactured therein has a relatively high roughness, and the display quality of the flat display device would be adversely affected.

SUMMARY OF THE INVENTION

With respect to the aforesaid technical problem, the present disclosure provides a method for manufacturing a substrate. According to the method, a silicon dioxide layer with a needed thickness can be manufactured on an amorphous silicon layer. During ELA procedure, the formation of protrusions at grain boundary of polysilicon can be prevented by the silicon dioxide layer. Therefore, the semi-conductive layer manufactured therein has a relatively low roughness.

The present disclosure provides a method for manufacturing a substrate, and the method comprises: step one, depositing an amorphous silicon layer on a base material; step two, depositing a silicon dioxide layer with a first thickness on the amorphous silicon layer; and step three, etching the silicon dioxide layer until a thickness thereof is reduced to a second thickness.

According to the method of the present disclosure, when the silicon dioxide layer is manufactured, since the silicon dioxide layer with the second thickness is obtained through etching the silicon dioxide layer with a larger thickness, the thickness of the finally obtained silicon dioxide layer is not necessarily 3 nm at most. Instead, the silicon dioxide layer can have an enough thickness so as to prevent the formation of protrusions at grain boundary of polysilicon. In this manner, the semi-conductive layer manufactured therein can have a relatively low roughness, and the display quality of the display device would not be affected. In addition, during the manufacturing procedure of the silicon dioxide layer, ozone is not used. Therefore, an ozone generator is not used, and the production equipment can be simplified. Moreover, since ozone is not used, a risk of environmental pollution resulted from ozone leakage can be avoided. Furthermore, during the etching procedure of the silicon dioxide layer, the silicon dioxide layer with a needed thickness can be obtained through controlling the etching condition, and the etching procedure can be simplified.

According to one embodiment, the method further comprises step four after step three, i.e., washing and performing Excimer Laser Annealing (ELA). Since the silicon dioxide layer is manufactured in step three, the base material needs only to be washed by water before ELA procedure. The operation is easily to be performed.

According to one embodiment, in step three, the silicon dioxide layer is etched by hydrofluoric acid. Hydrofluoric acid is a commonly used chemical reagent with a low price, and thus the cost thereof can be reduced.

According to one preferred embodiment, in step three, a time when etching is terminated is determined through monitoring etching time. The etching procedure can be controlled by this method, so that etching can be terminated automatically, rather than manually. In this manner, not only the work strength of the operator can be reduced, but also the time when etching is terminated can be controlled accurately, and the qualified rate of the product can be greatly improved.

According to one specific embodiment, measuring by mass percentage, a concentration of the hydrofluoric acid ranges from 0.5% to 1%. The first thickness is 10 nm or more. Preferably, the first thickness ranges from 10 nm to 50 nm. The second thickness ranges from 3 nm to 7 nm. It is discovered that, when the silicon dioxide layer is etched by hydrofluoric acid with the aforesaid concentration, an etching speed of the silicon dioxide layer is about 0.2 nm/s, and a time during which the silicon dioxide layer with the first thickness is etched into the silicon dioxide layer with the second thickness ranges from 0.5 minute to 3.6 minutes. In this case, an etching efficiency is relatively high, and the etching time can be controlled easily. Therefore, the qualified rate of the product can be improved. If the etching time is shortened further, a time error would increase significantly, and the qualified rate of the product would be reduced. If the etching time is prolonged, a time error would decrease, but the etching efficiency would decrease apparently, and the production efficiency of the substrate would be reduced.

According to one embodiment, the base material comprises a glass baseplate and a buffer layer that is arranged on the glass baseplate, and the amorphous silicon layer is arranged on the buffer layer. Preferably, the buffer layer comprises a SiNx layer and a SiOx layer. In this case, when polysilicon layer is formed by the ELA procedure, the amorphous silicon layer would not be adversely affected since it is arranged on the buffer layer. The display quality of the display device can be further improved.

Compared with the prior art, the present disclosure has the following advantages. First, according to the method of the present disclosure, the silicon dioxide layer with a needed thickness can be manufactured on the amorphous silicon layer. When the ELA procedure is performed, the silicon dioxide layer has an enough thickness to prevent the formation of protrusions at grain boundary of polysilicon, so that the semi-conductive layer manufactured therein can have a relatively low roughness. Second, since the silicon dioxide layer has a low roughness, the washing equipment and washing method used before the ELA procedure can be greatly simplified. Therefore, the manufacturing cost of the substrate can be reduced, and the competitiveness thereof can be improved.

BRIEF DESCRIPTION OF THE DRAWINGS

The present disclosure will be illustrated in detail hereinafter with reference to the embodiments and the drawings. In the drawings.

Figure 1:
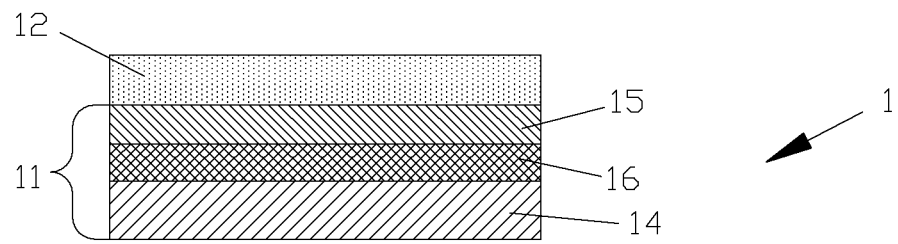
FIG. 1 schematically shows a step of depositing an amorphous silicon layer on a base material.

In the drawings, a same component is represented by a same reference sign. The drawings are not drawn according to actual scale.

DETAILED DESCRIPTION OF THE EMBODIMENTS

The present disclosure will be further illustrated hereinafter with reference to the drawings.

Figure 2:
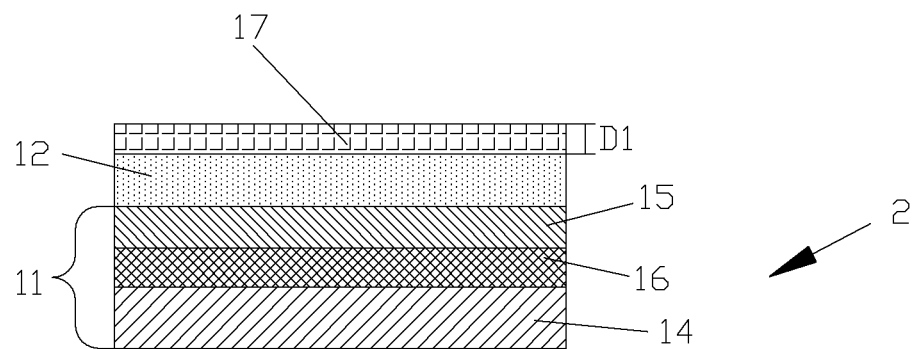
FIG. 2 schematically shows a step of depositing a silicon dioxide layer on the amorphous silicon layer.
Figure 3:
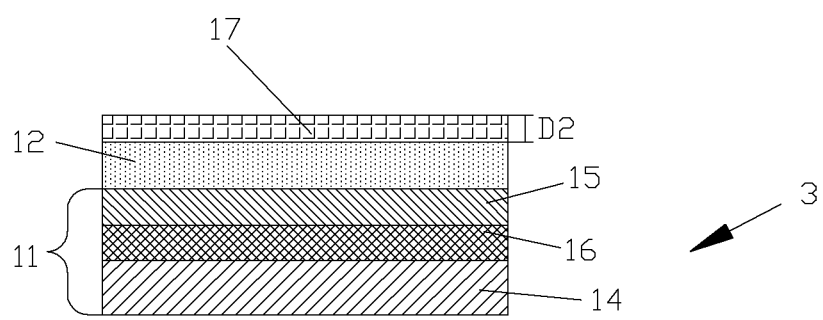
FIG. 3 schematically shows a step of etching the silicon dioxide layer.
Figure 4:
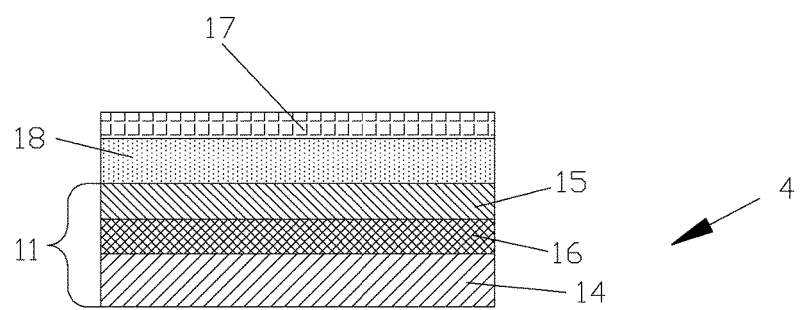
FIG. 4 schematically shows a step of Excimer Laser Annealing (ELA).

FIGS. 1 to 4 schematically show steps of a method according to the present disclosure. The method comprises the following steps:

in step one, an amorphous silicon layer 12 is deposited on a base material 11, as shown in FIG. 1;

in step two, a silicon dioxide layer 17 with a first thickness D1 is deposited on the amorphous silicon layer 12, as shown in FIG. 2; and in step three, the silicon dioxide layer 17 is etched until a thickness thereof is reduced to a second thickness D2, as shown in FIG. 3.

In step one, the base material 11 comprises a glass baseplate 14, as well as a first buffer layer 15 and a second buffer layer 16 that are arranged on the glass baseplate 14. According to one preferred embodiment, the first buffer layer 15 is SiNx, and the second buffer layer 16 is SiOx. According to another embodiment, the first buffer layer 15 is SiOx, and the second buffer layer 16 is SiNx. In this case, the amorphous silicon layer 12 is actually arranged on the first buffer layer 15 and the second buffer layer 16. Therefore, when an Excimer Laser Annealing (ELA) procedure (in step four as stated below) is performed on amorphous silicon layer 12, the amorphous silicon layer 12 would not be adversely affected by the first buffer layer 15 and the second buffer layer 16. In this manner, the ELA procedure can be greatly simplified, and the production difficulty of the substrate can be reduced.

In step two, the silicon dioxide layer 17 can be deposited with Plasma Enhanced Chemical Vapor Deposition (PECVD) method using silane and $N_2O$ as raw materials, which is well known for those skilled in the art, and the details thereof are no longer repeated here. It can be understood that, the silicon dioxide layer 17 can also be deposited through other suitable methods.

It should be noted that, the thickness D1 (i.e., the first thickness) of the deposited silicon dioxide layer 17 should be large enough, so that step three can be performed smoothly. According to one embodiment, the first thickness D1 is 10 nm or more. If the first thickness D1 is less than 10 nm, it can hardly be ensured that the second thickness D2 falls within the expected range after etching procedure in the following step three, and thus the qualified rate of the product would be reduced. However, if the first thickness D1 is too large, the etching time would be prolonged, and the production efficiency thereof would be reduced. Preferably, the first thickness ranges from 10 nm to 50 nm.

In step three, the silicon dioxide layer is etched by hydrofluoric acid. Hydrofluoric acid is aqueous solution of hydrogen fluoride, which can contain dopant. The purpose of addition of dopant is to perform etching better or to realize other beneficial effects. The hydrofluoric acid containing dopant also falls in the scope of the present disclosure.

In order to prevent the formation of protrusions at grain boundary of polysilicon and reduce the surface roughness thereof, the silicon dioxide layer 17 that is manufactured in step two can be etched until the thickness thereof is reduced to the second thickness D2 (i.e., from 3 nm to 7 nm). The second thickness D2 can be regulated through controlling the etching time. In this manner, the etching procedure can be controlled automatically, and thus the work strength of the operator can be reduced. In particular, since hydrofluoric acid has volatility and toxicity, once the etching procedure can be controlled automatically, the contact time of the operator with hydrofluoric acid (or hydrogen fluoride gas) can be reduced largely, thereby protecting the operator.

When the silicon dioxide layer is etched by hydrofluoric acid with the concentration of 0.5% to 1% (mass percentage), an etching speed of the silicon dioxide layer 17 is about 0.2 nm/s. With this etching speed, a time during which the silicon dioxide layer 17 with the first thickness D1 is etched into the silicon dioxide layer 17 with the second thickness D2 ranges from 0.5 minute to 3.6 minutes. In this case, an etching efficiency is relatively high, and the etching time can be controlled easily. Therefore, the qualified rate of the product can be improved. If the concentration of hydrofluoric acid is further increased, the etching time can be shortened. However, a time error would increase, and the qualified rate of the product would be reduced. If the concentration of hydrofluoric acid is reduced, the etching time would be prolonged, and the production efficiency thereof would be reduced.

The method further comprises step four after step three, i.e., washing and performing ELA so that the amorphous silicon layer is changed into a polysilicon layer 18.

Since the silicon dioxide layer 17 manufactured by steps one to three has a low roughness, the substrate can be cleaned thoroughly only by water washing. In this case, the washing equipment and washing steps used before the ELA procedure can be greatly simplified. Therefore, the manufacturing cost of the substrate can be reduced, and the competitiveness thereof can be improved.

According to the method of the present disclosure, during the manufacturing procedure of the silicon dioxide layer 17, ozone is not used. Therefore, an ozone generator is not used, the production equipment can be simplified, and the production cost thereof can be reduced. Moreover, since ozone is not used, a risk of environmental pollution resulted from ozone leakage can be avoided.

The present disclosure is illustrated in detail in combination with preferred embodiments hereinabove, but it can be understood that the embodiments disclosed herein can be improved or substituted without departing from the protection scope of the present disclosure. In particular, as long as there are no structural conflicts, the technical features disclosed in each and every embodiment of the present disclosure can be combined with one another in any way, and the combined features formed thereby are within the protection scope of the present disclosure. The present disclosure is not limited by the specific embodiments disclosed herein, but includes all technical solutions falling into the protection scope of the claims.

The invention claimed is:

1. A method for manufacturing a substrate, comprising:
depositing are amorphous silicon layer on a base material;
depositing a silicon dioxide layer with a first thickness on the amorphous silicon layer;
an etching step comprising etching the silicon dioxide layer until a thickness of the silicon dioxide layer is reduced to a second thickness; and
washing the substrate and performing excimer laser annealing to change the amorphous silicon layer into a polysilicon layer.

2. The method according to claim 1, wherein in the etching step, the silicon dioxide layer is etched by hydrofluoric acid.

3. The method according to claim 2, wherein in the etching step, an etching period ranges from 0.5 minute to 3.6 minutes.

4. The method according to claim 3, wherein measuring by mass percentage, a concentration of the hydrofluoric acid ranges from 0.5% to 1%.

5. The method according to claim 4, wherein the first thickness is 10 nm or more.

6. The method according to claim 5, wherein the first thickness ranges from 10 nm to 50 nm.

7. The method according to claim 4, wherein the second thickness ranges from 3 nm to 7 nm.

8. The method according to claim 1, wherein base material comprises a glass baseplate and a buffer layer that is arranged on the glass baseplate; and
wherein the amorphous silicon layer is arranged on the buffer layer.

9. The method according to claim 8, wherein the buffer layer comprises a SiNx layer and a SiOx layer.

* * * * *